United States Patent [19]
Hung

[11] Patent Number: 5,886,923
[45] Date of Patent: Mar. 23, 1999

[54] LOCAL ROW DECODER FOR SECTOR-ERASE FOWLER-NORDHEIM TUNNELING BASED FLASH MEMORY

[75] Inventor: Hsi-Hsien Hung, Fremont, Calif.

[73] Assignee: Integrated Silicon Solution Inc., Santa Clara, Calif.

[21] Appl. No.: 958,289

[22] Filed: Oct. 27, 1997

[51] Int. Cl.$^6$ .................................................. G11C 16/04
[52] U.S. Cl. ............................... 365/185.11; 365/185.13; 365/185.29; 365/185.33
[58] Field of Search .......................... 365/185.11, 185.13, 365/185.29, 185.33

[56] References Cited

U.S. PATENT DOCUMENTS

| | | | |
|---|---|---|---|
| 5,274,597 | 12/1993 | Ohbayashi et al. | 365/204 |
| 5,663,923 | 9/1997 | Baltar et al. | 365/203.03 |
| 5,732,040 | 3/1998 | Yabe | 365/230.03 |

OTHER PUBLICATIONS

Shin–ichi Kobayashi, Hiroaki Nakai, Yuichi Kunori, Takeshi Nakayama, Yoshikazu Miyawaki, Yasushi Terada, Hiroshi Onoda, Natsuo Ajika, Masahiro Hatanaka, Hirokazu Miyoshi, Tsutomu Yoshihara, "Memory Array Architecture and Decoding Scheme for 3V Only Sector Erasable DINOR Flash Memory", IEEE Journal of Solid–State Circuits, vol. 29, No. 4, Apr. 1994, pp. 454–458.

Primary Examiner—David Nelms
Assistant Examiner—Hien Nguyen
Attorney, Agent, or Firm—Douglas J. Crisman; Flehr Hohbach Test Albritton & Herbert LLP

[57] ABSTRACT

A semiconductor non-volatile memory device is disclosed which is based on the use of Fowler Nordheim electron tunneling to charge and discharge the isolated gates of the storage cells. The disclosed memory device includes global decoder circuitry capable of passing either positive or negative voltages to a set of global word lines controlling, local decoder circuitry. The local decoder includes a set of word line drivers, each of which sets the voltage level of a corresponding local word line in response to the voltage levels of its associated global word line and a collection of control signals. Each word line driver includes one p-channel transistor and two n-channel transistors. These three transistors collectively establish selected local word lines at appropriate voltages for erase, program and read operations. The three transistors also establish unselected local word lines at solid bias voltages that prevent disturbance of memory cells that are not the target of a memory operation.

17 Claims, 5 Drawing Sheets

LOCAL ROW DECODER FOR SECTOR-ERASE FOWLER-NORDHEIM TUNNELING BASED FLASH MEMORY

The present invention relates generally to non-volatile random access semiconductor memory devices wherein data can be written and erased by electrical means and, more particularly, to a non-volatile semiconductor memory device having local decoders for addressing specific memory sectors.

BACKGROUND OF THE INVENTION

The structure and functionality of non-volatile random access semiconductor memory devices has evolved in the last decade in order to match the specific needs and requirements of data storage and processing. Non-volatile memory devices are useful in many applications whenever data must be retained after devices are powered off. Upon restart of many computing or entertainment devices, initialization data must be available to enable a processor to load its programs and operating systems from peripheral storage such as hard disks or optical compact disks. Desirable features of non-volatile semiconductor memory devices include large capacity, high speed of writing, high speed of readout, repeated erasability, ease of writing and erasing of data as well as specific practical features that may allow for example reading or writing to specific sectors within the memory while protecting other sectors.

An early example of erasable non volatile memory is the Erasable Programmable Read Only Memory or EPROM. Such EPROM devices comprise a multiplicity of memory cells generally arranged in arrays of several thousand cells on the surface of a semiconductor chip, each cell comprising one or more metal oxide semiconductor (MOS) transistors. Each MOS transistor has a first control gate which consists of a metallic area separated from the drain or depletion area of the transistor by a thin oxide film and a second electrically insulated gate located between the control gate and the drain. Such cells retain the data in the form of stored electrical charge on the insulated gate. In order to erase an EPROM electrons generated by ultraviolet radiation from a special erase lamp are utilized. Such devices necessarily require the erasing of all sectors of the memory followed by a re-write of the new data to all sectors of the memory. The rewrite operation consists of injecting hot electrons into the floating gate. Such write-erase processes can be time consuming and subject to error generation especially if only small sections of the data stored need to be modified. An EPROM generally requires a high-voltage supply with substantial current-generating capability to generate the hot electrons. Furthermore, the process of generating hot electrons degrades the transistor gate regions, which limits the number of erase-write cycles that can be performed.

A more recent type of memory device, called EEPROM or electrically erasable PROM, utilizes electrons generated by the application of a high voltage difference between a control gate located above the insulated gate and the drain region of the MOS transistor, to pump charge into or out of the insulated gate. An EEPROM is distinguished from an EPROM by two features:

1) the program and erase operations can be accomplished on a byte-by-byte basis, whereas, in an EPROM, the erase operation is global and only the program operation is byte-by-byte; and 2) the mechanism underlying the program and erase operations in an EEPROM is Fowler-Nordheim (FN) tunneling, whereas, in an EPROM, it is hot-electron injection for programming (typically a high-current mechanism), and UV-erase for the erase operation.

Flash EPROMs, which have become the standard non-volatile memory are hybrid devices, share features of the EPROM and EEPROMS. That is, similarly to EPROMS, flash memories have a global (or sector, in more recent types) erase mode. Similarly to EEPROMS, flash memories can be erased and programmed electrically. The characteristics of the different types of non-volatile memory are summarized in Table 1. The present invention is implemented in a flash EPROM with tunneling program and sector tunneling erase. The basic operation of a Fowler-Nordheim flash EPROM is now described in reference to FIG. 1.

TABLE 1

| Memory Type | Program Mechanism | Erase Mechanism |
| --- | --- | --- |
| EPROM | hot-electron (high current) | global (non-byte) UV |
| EEPROM | FN-tunneling (low V) | FN-tunneling (byte operation) electrical |
| Flash EPROM | hot-electron or tunneling injection | FN-tunneling global or semi-global (non-byte operating) electrical |

Figure 1:
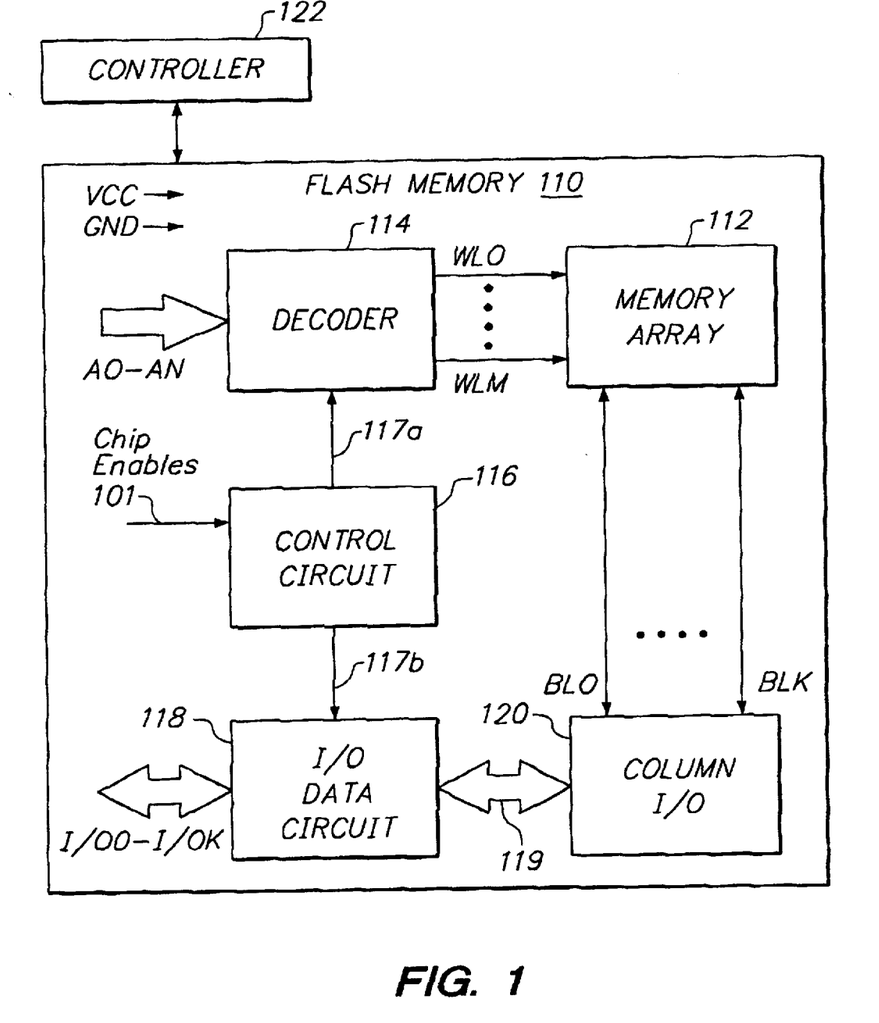
FIG. 1 is a block diagram of a typical flash memory characteristic of both the prior art and the present invention.

Referring to FIG. 1, there is shown a block diagram of a flash memory 110. This block diagram is also representative of the architecture of other types of memories. The flash memory 110 includes a memory array 112, an address decoder 114, a control circuit 116, an input/output (I/O) data circuit 118 and a column I/O circuitry 120. The memory 110 operates in response to external signals provided by a controlling device 122, such as a microprocessor.

The principle of operation of flash memories, such as the memory 110, is well known and therefore is only briefly described herein. The controller 122 initiates a memory operation by asserting a chip enable signal 101 and supplying address signals A0–AN (corresponding to 2N+1 memory locations) designating the address of a memory location where the operation is to be performed. If the memory operation is a write operation, the controller 122 supplies the data to be written to the addressed memory location via the bi-directional input output lines I/O0–I/Ok (corresponding to k+1 bit memory words). If the memory operation is a read operation, the stored information from the addressed location is read out from the same bi-directional input output lines I/O0–I/Ok. The memory 110 also provides connections for external power supply (Vcc) and ground (GND) signals.

The heart of the memory 110 is the memory array 112, which consists of flash memory cells, each capable of storing one bit of data, arranged in rows and columns. In the conventional manner, all of the cells in one row are energized for a memory operation (either a read or a write) by a word line WL uniquely associated with that row. A memory operation cannot be performed unless the word line associated with the target row of cells is activated.

At least a subset of the cells in a row (typically all of the cells that store data for one memory word) can be accessed simultaneously for a given memory operation via the bit lines BL. When the memory operation is a read, the bit lines BL are coupled to sense amplifiers in the column I/O 120 that "sense" the data stored in the corresponding cells of the row whose word line WL is active. When the memory operation is a write operation the bit lines BL carry the signals used to program the corresponding cells of the row associated with the active word line.

The control circuitry 116 controls the other blocks of the memory 110 in accordance with the chip enables 101. Depending on the operation to be performed, the control circuitry issues the appropriate control signals 117a, 117b to the decoder 114 and the I/O data circuit, respectively.

Regardless of whether the memory operation is a write or a read, the decoder 114 decodes the address signals A0–AN and activates the word line WL of the row that includes the memory word that is the target of the current memory operation. If the operation is a write, the I/O data circuitry 118 buffers the input data signals I/O0–I/Ok and outputs the buffered data to the column I/O 120 via the bi-directional data bus 119. The column I/O 120 then latches the input signals in parallel onto the corresponding bit lines BL0–BLK. The signals on the bit lines BL0–BLK are used to program the cells composing the word whose word line was activated for the current operation by the decoder 114.

If the operation is a read, sense amplifiers in the column I/O 120 sense the signals on the respective bit lines BL, convert the sensed signals into binary (e.g., high or low) voltages that represent the programmed state of the addressed word and output the word's bit values to the I/O data circuit via the bi-directional bus 119. The output data are buffered by the I/O data circuit 118 and latched onto the bi-directional data lines I/O0–I/Ok for use by the controller 122.

Figure 2:
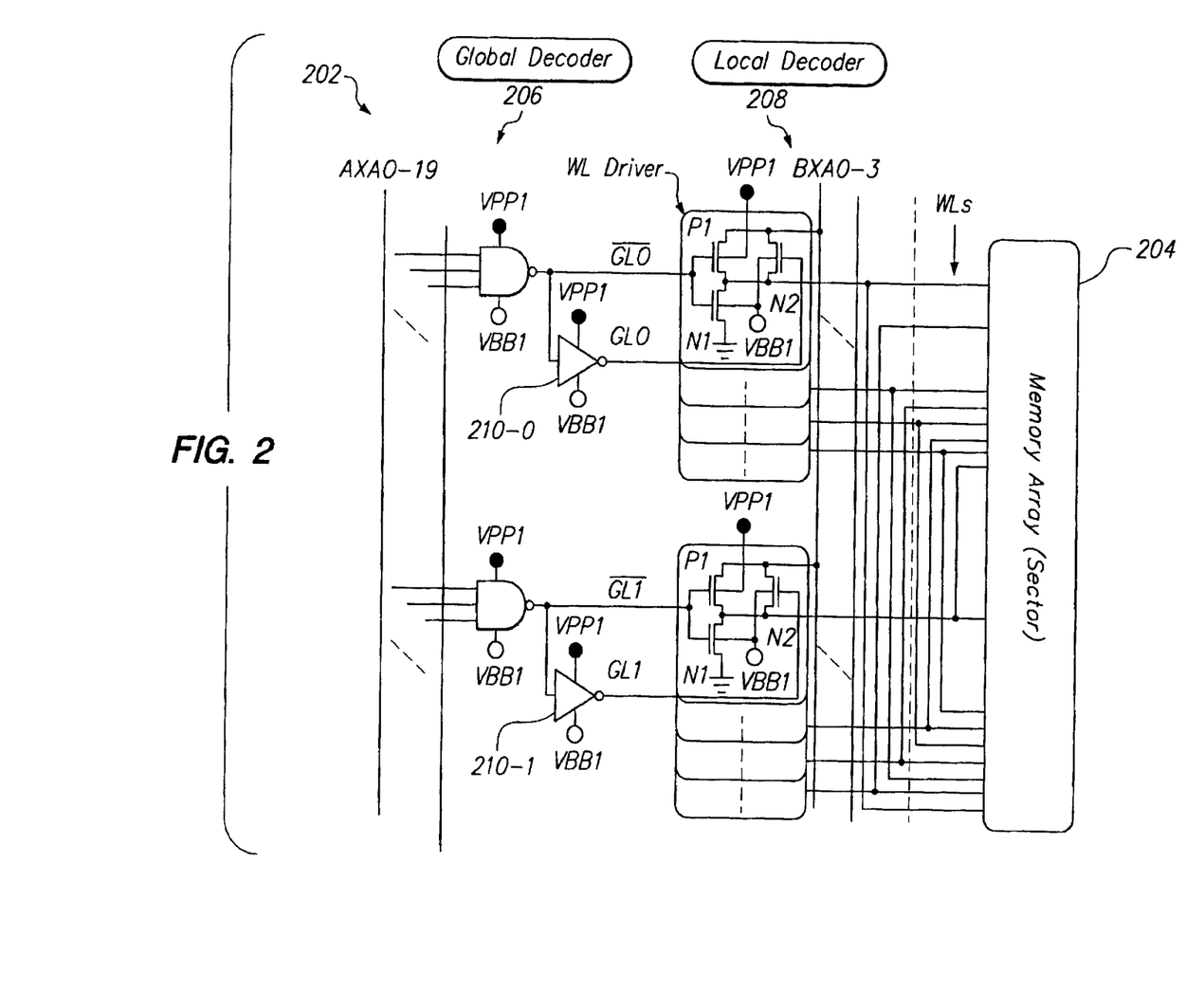
FIG. 2 is a block diagram of a prior art decoder 202 used in flash memory cells.

Referring to FIG. 2, there is shown a prior art implementation of a decoder 202 used with a flash memory array 204. The decoder 202 includes global decoders 206 and local decoders 208; is responsive to global and local address signals AXA0–19, BXA0–3 and positive and negative power supply signals VPP1, VBB1; and drives the word lines WL associated with the array 204. This decoder implements a common two-level decoding scheme where the global decoders 206 decode the global address bits AXA0–19 and the local decoders 208 decode the local address bits BXA0–3 (i.e., the total address space is 24 bits). The set of local word lines associated with a single global word line composes a sector. Because the array 204 employs flash cells, the decoder 202 must generate different voltage levels on selected and de-selected word lines WL depending on the mode of operation (i.e., erase, program or read modes). The operating voltage conditions for these signals for the different modes are shown in Table 2.

TABLE 2

|  | VPP1 | VBB1 | AXA0–19 | BXA0–3 |
| --- | --- | --- | --- | --- |
| Erase | 10 V | 0 V | 10 V/0 V | 10 V |
| Program | 0 V | –8 V | –8 V/0 V | –8 V/0 V |
| Read | 3 V | 0 V | 3 V/0 V | 3 V/0 V |

Except for the erase mode, two voltage levels are typically shown in Table 2 for the AXA0–19 and BXA0–3 signals, corresponding to voltage levels representing selected and unselected address bits. For the erase mode, only one signal level (10 V) is shown for the BXA0–3 signals. This is due to the fact that the flash memory including the decoder 202 employs a sector-erase strategy, where all cells associated with a single global word line are erased simultaneously.

When a global decoder 206-$i$ decodes its preset address from the address signals AXA0–19, it generates a low signal (i.e., a signal at the VBB1 level) on its inverted global word line /GLi and a high signal (i.e., a signal at the VPP1 level) on its corresponding non-inverted global word line GLi, which is generated from the /GLi signal with an inverter 210. Otherwise, the global decoder 206$i$ generates high and low signals on the global word lines /GLi and GLi, respectively. Each global word line is coupled to a group of local decoders/word line drivers 208, each of which controls a respective local word line WLj. Each local decoder 208$j$ drives its local word line WLj to either the VPP1 or VBB1 voltage level as a function of the voltage levels of the associated global word line GLi; the voltage supplies VPP1, VBB1; and the address signals BXA0–3.

Referring to Table 2, in erase, program and read modes, the local decoder 208 drives selected word lines WL to 10 V, –8 V and 3 V respectively, where selected word lines are those word lines associated with a selected global word line and a set of selected BXA0–3 address bits. The local decoder 208 passes these different voltage levels using two n-channel transistors N1, N2 and a p-channel transistor P1 connected as shown in FIG. 2. The operation of the local decoder 208 is now described for erase and program modes.

In erase mode, the word line WL voltage level depends only on the state of the global word lines. Selected global word lines /GLi, GLi are at 0 V and 10 V. In each local decoder 208$j$ coupled to a selected global word line the transistors P1 and N2 couple the high voltage (10 V) on a corresponding one of the address lines BXAj to a respective word line WLj. This causes the entire sector to be erased (i.e., all of cells in that sector will have a high threshold Vt following the erase operation). Unselected global word lines /GLi, GLi are at 10 V and 0 V. The transistor N1 in each of the local drivers 208 coupled to a deselected global word line pulls its local word line WL down to 0 V, ensuring that the associated row of cells is not erased.

In program mode, there are four combinations of selected global word lines and address bits BXA0–3 that determine the word line WL voltage levels as follows:

(1) selected GWL, selected BXAj=>WL=–8 V (2) selected GWL, deselected BXAj=>WL=0 V (3) deselected GWL, selected BXAj=>+|VtP1|>WL>–|VtN1|

(4) deselected GWL, deselected BXAJ=>+|VtP1|>WL>–|VtN1|.

In program mode, selected global word lines /GLi, GLi are at –8 V and 0 V. In a local driver 208$j$ coupled to a selected address bit BXAJ at –8 V, the transistors P1 and N2 each couple the low voltage (–8 V) on the selected address line BXAJ to the selected local word line WLj. This causes the row of cells coupled to the word line WLj and the selected address lines BXAj to be programmed (i.e., all of the selected cells in that row will have a low threshold Vt after the programming operation). In each of the unselected local drivers 208$k$ (where k is different from j) associated with the selected global word line, the transistors P1 and N2 couple their word lines WLk to 0 V.

In program mode, unselected global word lines /GLi, GLi are at 0 V and –8 V. In a local driver 208$j$ coupled to a selected address bit BXAJ at –8 V, the transistor N1 couples the local word line WLj to +|VtP1|>WL>–|VtN1|. In a local driver 208$k$ coupled to an unselected address BXAk at 0 V, the transistors P1 and N1 combine to set the word line WLj voltage level to: +|VtP1|>WL>–|VtN1|.

Thus, for selected global word lines GWL, the voltage level of the associated selected and unselected local word lines WL is well-controlled. However, for unselected global word lines, the local word line WL voltage levels are unstable for both selected and unselected local word lines. Due to these variations in word line levels, memory cells coupled to unselected global word lines GWL could be disturbed during program operations if the threshold voltage Vt of the transistor N1 is sufficiently large.

SUMMARY OF THE INVENTION

In summary, the present invention defines word line decoder and control circuitry for use in a semiconductor, non-volatile memory device that employs Fowler-Nordheim electron tunneling to charge and discharge the isolated gates of the storage transistors.

Particularly, the present invention defines control circuitry for use in a non-volatile, electrically-erasable semiconductor memory device capable of operating in read, write and erase modes that includes a plurality of sectors, each having a plurality of MOS storage cells arranged in rows controlled by respective local word lines WLi (i=0 to M). A preferred embodiment of the control circuitry includes a plurality of local decoders within each of the sectors. Each of the local decoders includes one p-channel MOS transistor and two n-channel MOS transistors configured to generate 2 local word line voltage for a respective one of the local word lines WLi in response to a set of control signals and a respective global word line (GWLB) associated with the sector including the local decoder. The preferred embodiment also includes a plurality of global decoders configured to control the voltage of respective global word lines GWLB; such that, in the write mode, a jth global decoder (=1 to N) sets the jth global word line GWLBj to a small positive voltage (SPV) when the jth sector is selected and to a large negative supply voltage VNS when the jth sector is not selected.

Preferably, the SPV is selected so that, in the write mode, when the control signals indicate that the ith local word line is predecoded while the GWLBj indicates that the jth sector is selected, the ith local decoder in the jth sector sets the ith local word line to the VNS level and the kth local decoders (k not equal to i) sets the kth local word lines to a voltage between 0 V and a small negative voltage (SNV) that will not disturb the cells whose gates are coupled to kth word lines of jth sector. The VNS is selected so that, in the write mode, when the GWLBj indicates that the sector j is selected, the local decoders in the jth sector set the local word lines to 0 V.

In one embodiment, the control signals include LXTB, XTB and HXT signals. The p-channel transistor has a drain, source, gate and bulk respectively connected to the associated HXT signal, WL and GWLB and the VPS signal. A first of the n-channel transistors has a drain, source, gate and bulk respectively connected to the associated LXTB, WL and GWLB and the VNS signal. A second of the n-channel transistors has a gate, source, drain and bulk respectively connected to a pull down signal XTB, the VNS signal, the associated GWLB and the VNS signal. In the write mode, the p-channel transistor sets the respective WL voltages for the de-selected sectors from the associated HXT signal, and the first n-channel transistor sets the respective WL voltages for the selected sectors from the associated LXTB signal.

In various embodiments that can be employed with different types of non-volatile flash memories:

(1) the VPN is -11 V, the SPV is 3 V and the SNV is between 0 V and -0.5 V;

(2) the VPN is -11 V, the SPV is between 0.5 V and 3 V, and the SNV is between 0 V and -0.5 V; or (3) the VPN is between -6 V and -15 V, the SPV is between 0.5 and 3 V, and the SNV is between 0 V and -0.5 V.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

As already mentioned, a significant problem with the prior art is that the voltage levels of word lines associated with unselected global word lines are unstable, which can cause cells on unselected global word lines to be disturbed during programming. This problem can be solved using a local decoder with four transistors that collectively ensure that the voltage levels of local word lines associated with either selected or unselected address bits BXAj tied to unselected global word lines GWL are at rock-solid levels that will not interfere with whatever memory operation is underway. A novel local decoder of this type is described in a co-pending U.S. patent application filed by ISSI ("Local Row Decoder and Associated Control Logic for Sector-Erase Fowler-Nordheim Tunneling Based Flash Memory Chip"). The local decoder described therein sets the WL program mode voltage levels for the four different combinations of GWL and local word line addresses (corresponding to the BXAj address bits) as follows:

(1) selected GWL, selected local word line=>WL=-11 V (2) selected GWL, unselected local word line=>WL=0 V (3) deselected GWL, selected local word line=>WL=0 V (4) deselected GWL, unselected local word line=>WL=0 V.

These voltage levels are different from those used by the prior art local decoder 202 (FIG. 2), but the principals of operation of both memories (and the memory of the present invention) is the same. That is, programming a cell involves setting the local word line of a row of cells to be programmed to a high negative voltage that induces tunneling of positive charges to the floating gate, resulting in a low cell threshold Vt. Similarly, the novel four transistor circuit provides four solid word line voltage levels for read mode operations and two solid word line voltage levels for the erase mode operations.

The novel four transistor local decoder solves the voltage level problems mentioned above but also adds complexity and size to the flash memory chip due to the one extra transistor it requires over the prior art local decoder circuit 202. A preferred embodiment is now described in reference to FIG. 3 that provides solid word line voltage levels for the four different operating conditions while requiring only three transistors.

Figure 3:
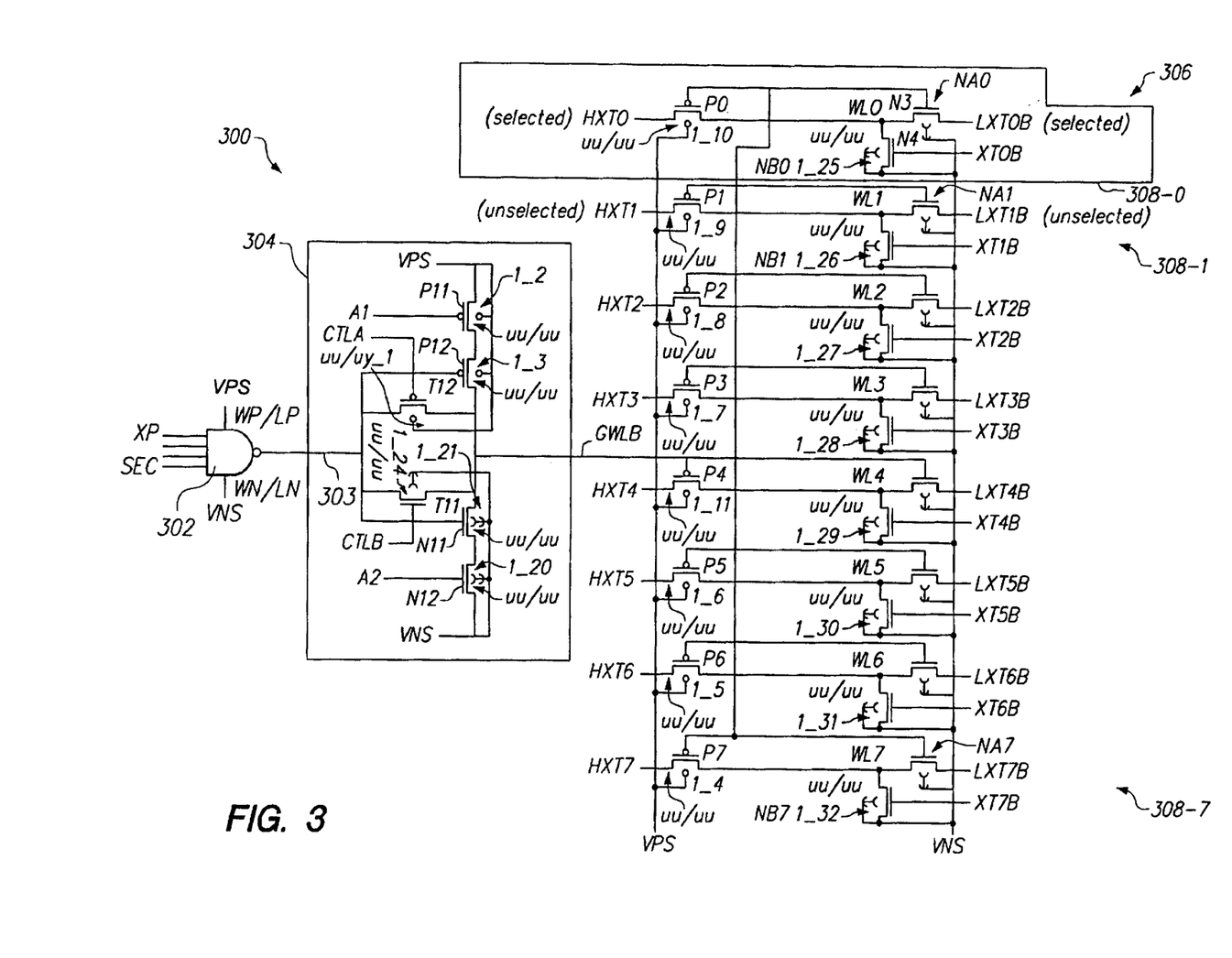
FIG. 3 is a circuit diagram of the preferred embodiment.

Referring to FIG. 3, there is shown a circuit diagram of preferred row decoder circuitry 300 associated with a single global word line GWL and a set of local word lines WLj. In the preferred embodiment, there are 8 local word lines WLj per global word line GWL; different numbers (e.g., 4, 16 or 32) of local word lines can also be associated with a global word line GWL. A memory chip incorporating the circuitry 300 includes a duplicate of the decoder circuitry 300 for each global word line GWL. Thus, for a preferred embodiment with 256 global word lines, there are 256 instances of the circuitry 300.

The circuitry 300 includes a global decoder 302, a control circuit 304 (corresponding to the inverters 210i of FIG. 2), and a set 306 of local decoders 308j. Each local decoder 308j drives a respective local word line WLj (within a sector each sub-label j corresponds to a specific j-th row local word line). The set of local word lines WL0–WL7 is associated with one global word line GWL. In the preferred embodiment, each of the local decoders 308j includes three transistors: a p-channel transistor Pj and two n-channel transistors NAj and NBj.

Each global word line decoder 302 is coupled to Vps and Vns inputs, where Vps and Vns are positive and negative power supply voltages that vary with the operational mode. Each global decoder 302i selects or deselects a corresponding global word line GWL by setting its output 303 to Vps or Vns, respectively. A global decoder 302 can be a row or a column decoder; however, in the preferred embodiment the global decoders 302 are word line decoders.

The output 303 of the global decoder 302 constitutes one of the inputs to a corresponding control logic circuit 304. The remaining control logic input lines include CTLA, CTLB, A1, A2, Vps and Vns. Within each control logic circuit 304 there are three p-channel MOS transistors P11, P12 and T12, and three N-channel MOS transistors N11, N12 and T11. The CTLA input is connected to the gate of the transistor T12. The drain of the transistor T12 is connected to the output 303 of the global decoder 302, the source of the transistor T12 is connected to the output GWLB of the control logic circuit 304 and the bulk of the transistor T12 is connected to Vps. The CTLB input is connected to the gate of the transistor T11. The drain of the transistor T11 is connected to the output 303 of the global decoder 303, the source of the transistor T11 is connected to the output GWLB of the control logic circuit 304 and the bulk of the transistor T11 is connected to Vns. Note that Vps and Vns vary depending on the mode of operation. Thus, the transistors T11 and T12 are capable of acting as switches connecting the output 303 of a global decoder 302 to the inputs of the corresponding local decoders 308.

Also within the control circuit 304, the output 303 of a global decoder is connected to the gates of the transistors N11 and P12. All of the transistors P11, P12, N11, N12 are connected in series in an inverter type configuration and the connection between transistors P12 and N11 is further connected to the output GWLB of a control logic circuit 304. The transistors P11 and P12 are able to pass Vps to the output GWLB of a control logic circuit 304 while the transistors N11 and N12, when both are active, are able to pass Vns to the output GWLB.

The output GWLB of each control logic circuit 304 is connected to a set 306 of local decoders 308j. Each local decoder outputs a local word line WLj, which is connected to the gates of all of the storage cells in a row.

Each local. decoder 308j includes one p-channel MOS transistor Pj and two n-channel MOS transistors NjA and NjB. In addition to the global word line GWLB, the local decoders 308j have five other inputs labeled HXTj, XTjB, LXTjB, Vps and Vns. All HXTj signals with the same sub-label j are connected together. For example, the HXT-0 lines from different sectors are connected together and the HXT-3 lines from different sectors are connected together. The HXTJ signal is connected to the input of the transistor Pj. The output, gate and bulk of the transistor Pj are connected respectively to a local word line WLj, the global word line GWLB and Vps. The role of the transistor Pj is to couple selected HXTj signals to the word line WLj when the associated global word line GWLB is selected.

The transistor NAj connects a word line WLj to a corresponding LXTjB signal and has a gate connected to the output GWLB of the control logic circuit 304. The transistor NBj connects the word line WLj to Vns and has a gate connected to the XTJB signal. Both transistors NAj and NBj ensure that the word line is solidly grounded at Vns during read operations while NAj serves to provide a solid ground at Vns during all read, write and erase operations. As is described below, in contrast to the prior art, the present invention provides this solid ground for all local word lines WL associated with unselected global word lines GWLB.

In a first preferred embodiment, the physical layout of the memory device in which the preferred embodiment is incorporated is such that all three transistors Pj, NAj, NBj corresponding to the word line WLj, are located near one end of that word line WLj. In a second embodiment, the transistor Pj is located near one end of a word line WLj while NAj and NBj are located near the opposing end of the same word line WLj. The operation of the preferred embodiment is now described for the read, program and erase modes.

Table 3 shows the voltages applied to the different control lines GWLB, HXTj, XTjB, LXTjB, A1, A2, CTLA, CTLB, Vps and Vns in the read mode of operation, and the resulting local word WL voltage level. Table 4 shows the voltages applied to the same control lines and the resulting local word line levels in the write mode of operation and Table 5 shows the voltages applied to the control lines and the resulting local word line levels in the erase mode of operation. In Tables 3 through 5 the first column indicates whether a local word line WL is selected or deselected. Note that in the read mode, a word line can be selected by applying 0 V to the GWLB global word line, Vcc to the HXT control line and 0 V to the XTB and LXTB control line. Deselecting a word line in the read mode can be done in three different manners, depending on whether that word line lies within a selected or a deselected sector. That is, a local word line can be deselected in both selected or deselected sectors if it is not predecoded (herein, a word line is said to be predecoded if its associated predecoder signal, such as HXT for the read mode, is active) and can also be deselected in a deselected sector if it is predecoded. For example, line 4 of Table 3 pertains to local word lines WL that are predecoded (i.e., have HXT at VCC), but are not selected because they are in a deselected sector (i.e., have GWLB=VCC).

TABLE 3

Read Mode

| word line | GWLB | HXT | XTB | LXTB | A1 | A2 | CTLA | CTLB | Vps | Vns | WL |
| --- | --- | --- | --- | --- | --- | --- | --- | --- | --- | --- | --- |
| select | 0 V | Vcc | 0 V | 0 V | Vcc | 0 V | 0 V | Vcc | Vcc | 0 V | VCC |
| deselect | Vcc | 0 V | Vcc | 0 V | Vcc | 0 V | 0 V | Vcc | Vcc | 0 V | 0 V |
| deselect | 0 V | 0 V | Vcc | 0 V | Vcc | 0 V | 0 V | Vcc | Vcc | 0 V | 0 V |
| deselect | Vcc | Vcc | 0 V | 0 V | Vcc | 0 V | 0 V | Vcc | Vcc | 0 V | 0 V |

Referring to FIG. 3, in the read mode a memory sector is selected by means of a global decoder 302. The selected global decoder 302 has an output of 0 V while all de-selected global decoders have an output of Vcc. Transistors T11 and T12 within the corresponding control logic 304 conduct and pass the 0 V to the local decoders 308 of the selected memory sector. A specific row j is selected by taking the corresponding line HXTj to a voltage Vcc. The transistor Pj conducts and passes Vcc to the selected word line while de-selected word lines are held at 0 V. The transistor NBj conducts in the de-selected rows of a selected sector, holding deselected word lines at 0 V. The transistor NAj conducts in de-selected rows of deselected sectors, holding these rows at LXTjB=0 V.

Figure 4:
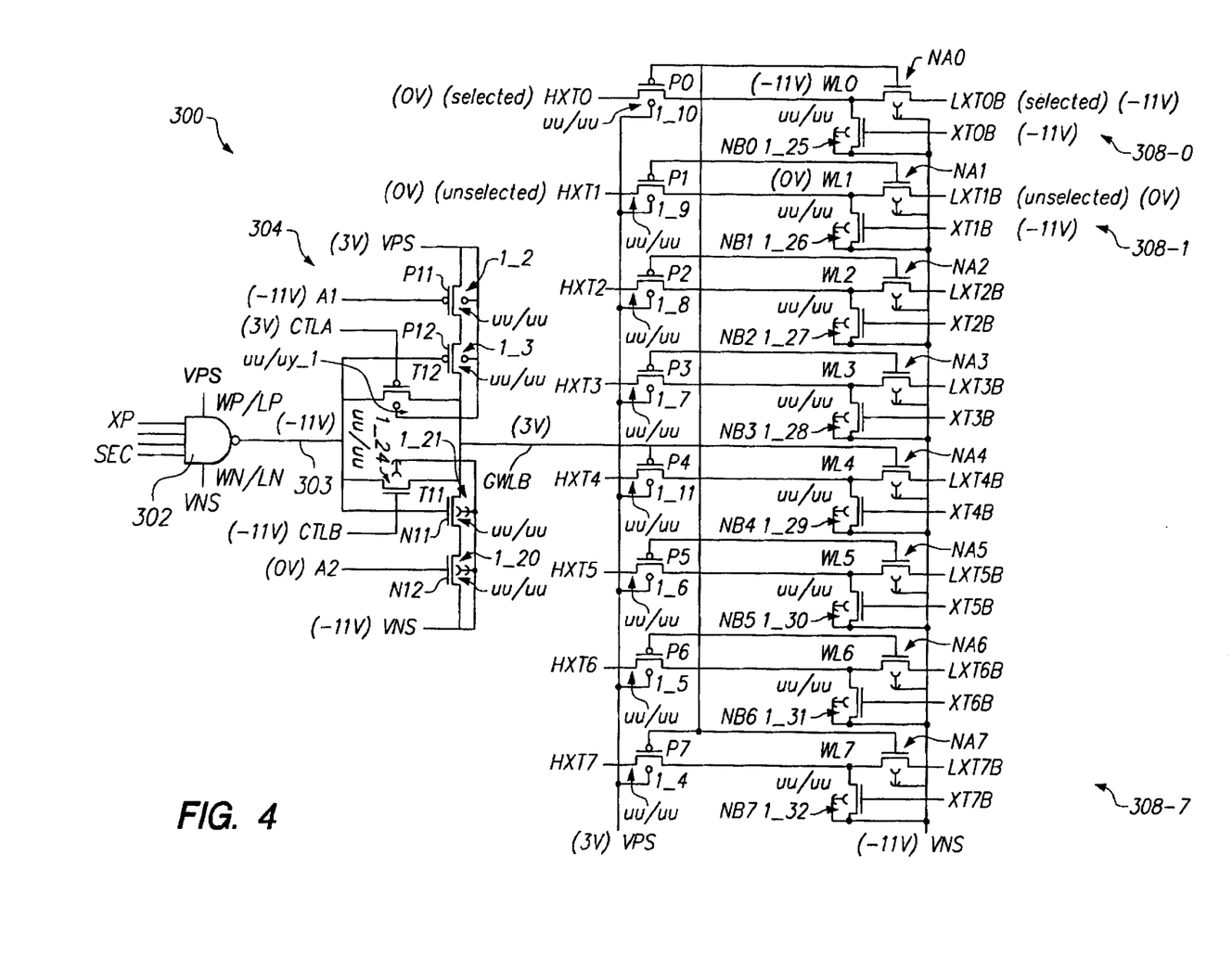
FIG. 4 is a circuit diagram of the preferred embodiment that illustrates the program mode of operation for selected global word lines.

In the write mode, the gates of all storage transistors in a selected row are held at a negative voltage Vns of about −11 V, while the drain of the storage transistor is connected to the line carrying the bit to be written. The gates of all storage transistors in an unselected row (whether associated with a selected or unselected global word line GWLB) are held firmly at 0 V without a fourth transistor. As described above, a local word line can be deselected in both selected or deselected sectors if it is not predecoded (herein, a word line is said to be predecoded if its associated predecoder signal LXTB is active) and can also be deselected in a deselected sector if it is predecoded. It is described how this is done in reference to FIGS. 4 and 5.

of the transistors NA. If the global word line were set to 0 V as in the prior art, an additional transistor would be required to set the unselected local word lines corresponding to a selected global word line to a solid bias voltage. The present invention also includes an alternative embodiment wherein the selected global word line GWLB voltage level is set to a small positive voltage that is less than the threshold of the transistors NAk. While this embodiment does not set the unselected local word lines WLk to 0 V, with such an embodiment the unselected word lines are established at a voltage level that is less negative than that established by the prior art, where a deselected local word line is set to approximately−2 V. For example, in the alternative embodiment, if the selected GWLB level were set to approximately 1.5 V, the deselected local word line would go to approximately no less than −0.5 V, a voltage much less likely to disturb programmed cells.

Figure 5:
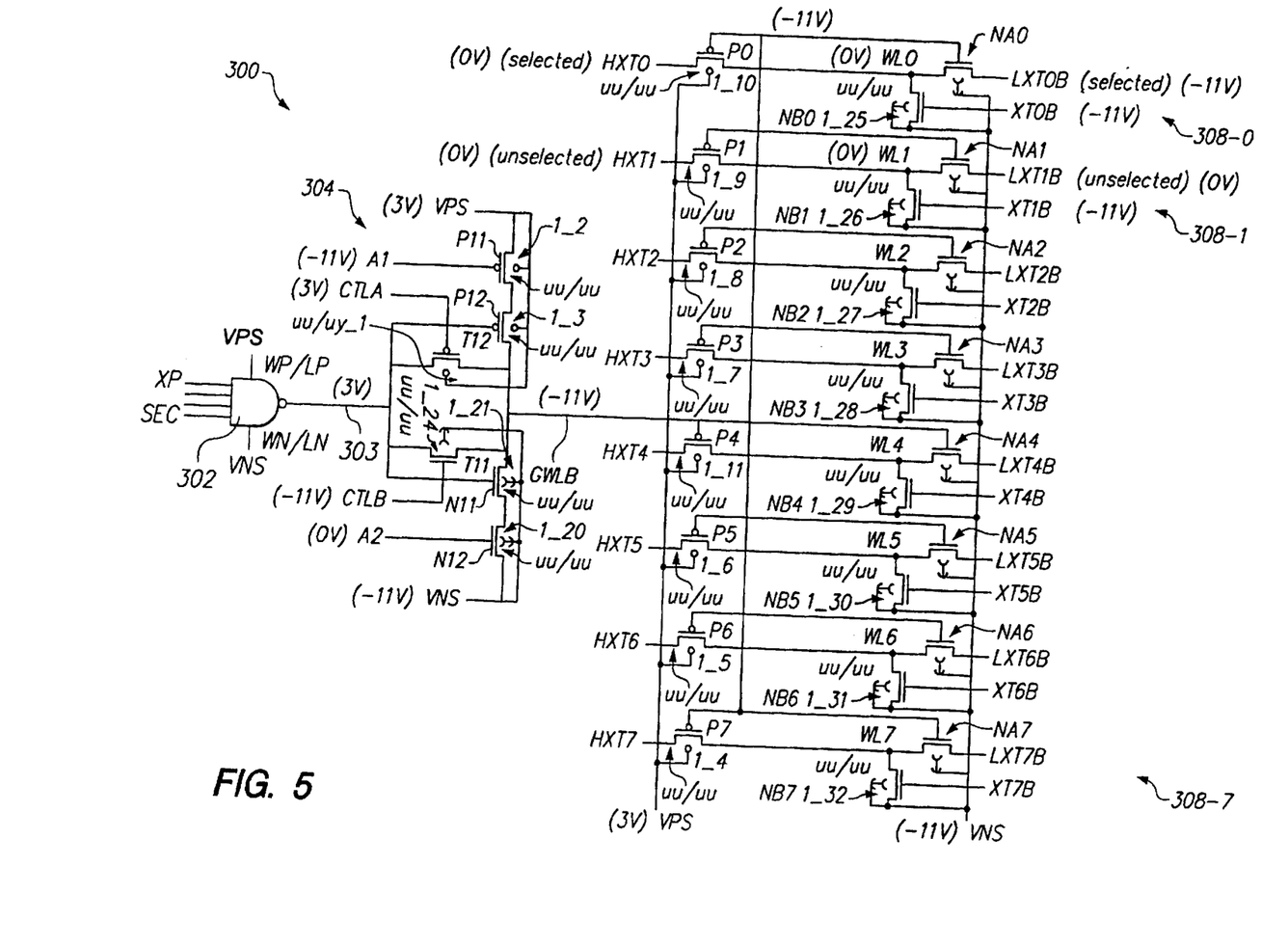
FIG. 5 is a circuit diagram showing the preferred embodiment that illustrates the program mode of operation for unselected global word lines.

Referring to FIG. 5, there is shown a circuit diagram of the circuitry 300 that indicates voltage levels of the control

TABLE 4

| word line | GWLB | HXT | XTB | LXTB | A1 | A2 | CTLA | CTLB | Vsp | Vns | WL |
|---|---|---|---|---|---|---|---|---|---|---|---|
| select | 3 V | 0 V | −11 V | −11 V | −11 V | 0 V | 3 V | −11 V | 3V | −11 V | −11 V |
| deselect | −11 V | 0 V | −11 V | 0 V | −11 V | 0 V | 3 V | −11 V | 3 V | −11 V | 0 V |
| deselect | 3 V | 0 V | −11 V | 0 V | −11 V | 0 V | 3 V | −11 V | 3 V | −11 V | 0 V |
| deselect | −11 V | 0 V | −11 V | −11 V | −11 V | 0 V | 3 V | −11 V | 3 V | −11 V | 0 V |

Write Mode

Referring to FIG. 4, there is shown a circuit diagram of the circuitry 300 that indicates voltage levels of the control signals and outputs shown in Table 4 for a selected global word line. A key difference between the preferred embodiment and the prior art is that the Vps and CTLA control signals are set during program operations to a small positive voltage (e.g., 3 V) rather than 0 V. As a result, instead of being charged up to 0 V as in the prior art, a selected global word line GWLB generated by the global decoder 302 and control circuitry 304 is charged up to 3 V. A selected local word line WLj is indicated by a −11 V signal on the corresponding LXTJB signal. An unselected local word WLk is indicated by a 0 V signal on the corresponding LXTkB signal. The HXT signals are at 0 V for both unselected and selected word lines and the XTB signals are at −11 V for both unselected and selected local word lines.

Consequently, the selected local word line WLj is pulled down to −11 V by the corresponding transistor NAj. The transistors NAk also set the level of the unselected local word lines WLk. This is possible as the selected global word line GWLB voltage level (e.g., 3 V) exceeds the threshold of the transistors NAk, which, as a result, turn on and couple their 0 V LXTkB signals to the corresponding local word lines WLk. This type of dual operation of the transistors NA is made possible by charging the selected global word line to a small positive voltage that is greater than the threshold signals and outputs shown in Table 4 for an unselected global word line. As in FIG. 4, the Vps and CTLA control signals are set during program operations to a small positive voltage (e.g., 3 V) rather than 0 V. This does not impact the unselected global word lines GWLB, which are set at the Vns level (e.g.,−11 V) by the global decoder 302 and control circuitry 304. As in FIG. 4, a selected local word WLj is indicated by a −11 V signal on the corresponding LXTjB signal. An unselected local word WLk is indicated by a 0 V signal on the corresponding LXTkB signal. The HXT and XTB signals are at the same levels shown in FIG. 4 for both unselected and selected word lines.

Consequently, even though its LXTJB signal is at −11 V, a corresponding transistor NAj is unable to pull the selected local word line WLj down to −11 V as its gate, is at −11 V, preventing the transistor NAj from turning on. Instead the transistor Pj couples the 0 V HXTj signal to the word line WLj, driving that word line WLj to 0 V. The transistors Pk associated with unselected local word lines drive their associated local word lines to 0 V in the same manner as the transistor Pj. Consequently, a solid bias at 0 V is established for the unselected word lines.

Erase mode operations, while similar to those described in the co-pending ISSI application, are summarized herein for completeness in reference to Table 5.

TABLE 5

| sector | GWB | HXT | XTB | LXTB | A1 | A2 | CTLA | CTLB | Vps | WL | Vns |
|---|---|---|---|---|---|---|---|---|---|---|---|
| select | 0 V | 11 V | 0 V | 0 V | 11 V | 0 V | 0 V | 11 V | 11 V | 11 V | 0 V |
| deselect | 11 V | 11 V | 0 V | 0 V | 11 V | 0 V | 0 V | 11 V | 11 V | 0 V | 0 V |

Erase Mode

In the erase mode, the control gates of all storage transistors in a sector to be erased are taken to a positive high voltage Vps of about 11 V by selecting the sector through the corresponding global decoder 302. The output GWLB of the selected global decoder 302 is 0 V. The transistors T11 and T12 in the control logic circuit 304 conduct and transmit the 0 V to the local decoders 308 of the selected sector. All of the HXTj signals are held at 11 V, causing the transistors Pj to pass the 11 V to all of the local word lines WL within a selected sector. All the gates in the selected sector which have positive charge on their floating gates are then discharged.

The control gates of all storage transistors in a sector that is not selected for erasing are held at 0 V by the transis tors NAj, which couple their respective 0 V LXTjB signals to the corresponding loal word lines WLj. The transistors NAj are active for this mode of operation due to the high voltage (11 V) at their gates from the 11 V GWLB signals associated with unselected global word lines.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. In particular, the word line and control voltages can be different f rom those described herein as appropriate for the memory in which the present decoder technology is implemented. For example, the Vns voltage can be any negative voltage between approximately –6 V and –15 V, in which case the de-selected global word lines GWLB and selected local word lines WL are within the same range of voltages.

What is claimed is:

1. Control circuitry for use in a non-volatile electrically erasable semiconductor memory device capable of operating in read, write and erase modes that includes a plurality of sectors, each having a plurality of MOS storage cells arranged in rows controlled by respective local word lines, the control circuitry comprising:
   a plurality of global decoders associated with respective sectors, each of the global decoders being configured in the write mode to generate respective global select signals at –11 V when the respective sector is selected and 3 V when the respective sector is de-selected;
   control logic within each of the sectors coupled to a respective global decoder that sets the voltage on a corresponding global word line (GWLB), the control logic being configured in the write mode to generate from the –11 V global select signal voltage a 3 V global word line voltage when the respective sector is selected and to generate from the 3 V global select signal voltage a –11 V global word line voltage when the respective sector is de-selected; and
   a plurality of local decoders within each of the sectors, each of the local decoders being configured to generate a local word line voltage for a respective local word line (WL) in the write mode in response to a respective local select signal (LXTB) and the global word line (GWLB) for the respective sector, selected and deselected local word lines WL being indicated respectively by LXTB voltages of –11 V and 0 V; such that, in the write mode:
      when the corresponding GWLB voltage is 3 V, the local decoder for the selected WL couples the corresponding –11 V LXTB voltage to the selected WL and the local decoders for the deselected WLs couple the 0 V LXTB voltages to the corresponding deselected WLs.

2. The control circuitry of claim 1, wherein the plurality of local decoders also respond to respective pull up control signals (HXT), each of which is at 0 V in the write mode; such that, in the write mode:
   when the corresponding GWLB voltage is –11 V, the associated local decoders couple the 0 V HXT signals to the respective local word lines, ensuring a solid ground level for the WLs associated with de-selected sectors.

3. The control circuitry of claim 2, wherein the local decoder comprises:
   a p-channel transistor; and
   two n-channel transistors;
   the p-channel transistor having a drain, source, gate and bulk connected, respectively to the associated HXT signal, WL, GWLB and a VPS signal, which is at 3 V in the write mode;
   a first of the n-channel transistors having a drain, source, gate and bulk connected, respectively, to the associated LXTB signal, and WL and GWLB and a VNS signal, which is at –11 V in the write mode;
   a second of the n-channel transistors having a gate, source, drain and bulk connected, respectively, to an associated pull down signal (XTB), which is at –11 V in the write mode, the VNS signal, the associated GWLB, and the VNS signal;
   such that, in the write mode:
      the p-channel transistor sets the respective WL voltages for the de-selected sectors; and
      the first n-channel transistor sets the respective WL voltages for the selected sectors.

4. The control circuitry of claim 2, wherein each of the plurality of global decoders is further configured in the read mode to set the respective global select signal to 0 V/VCC when the respective sector is selected/deselected and, in the erase mode, to set the respective global select signal to 0 V/11 V when the respective sector is selected/de-selected.

5. The control circuitry of claim 4, wherein the control logic is further configured to transmit the global select signal voltage on a corresponding global word line (GWLB) in the read and erase modes.

6. The control circuitry of claim 5, wherein the local decoder comprises:
   a p-channel transistor; and
   two n-channel transistors;
   the p-channel transistor having a drain, source, gate and bulk respectively connected to the associated HXT signal, WL and GWLB, and the VPS signal, which is at VCC, 3 V and 11 V in the read, write and erase modes, respectively; the HXT signal in the read mode being at VCC for predecodded WLs and at 0 V for un-predecoded WLs, the HXT signal in the erase mode being at 11 V;
   a first of the n-channel transistors having a drain, source, gate and bulk connected, respectively, to the associated LXTB signal, WL and GWLB and a VNS signal, which is at OV, –11 V and 0 V in the read, write and erase modes, respectively; the LXTB signal being at 0 V in the read and erase modes;
   a second of the n-channel transistors having a gate, source, drain and bulk connected, respectively, to a pulldown signal (XTB), the VNS signal, the associated global word line, and the VNS signal, the XTB signal being at 0 V for predecoded WLs and at VCC for un-predecoded WLs in the read mode, at –11 V in the write mode and at 0 V in the erase mode; such that:

in the write mode: (1) the p-channel transistor sets the respective local word line voltage for the de-selected sectors, and (2) the first n-channel transistor sets the respective local word line voltage for the selected sectors;

in the read mode: (1) the p-channel transistor sets the respective local word line voltage for the selected local word line in the selected sector, (2) the first n-channel transistor sets the respective local word line voltage for a de-selected local word lines in a de-selected sector, and (3) the second n-channel transistor sets the respective local word line voltage for the de-selected local word line in the selected sector; and in the erase mode: (1) the p-channel transistor sets the respective local word line voltage for the selected sector, and (2) the first n-channel transistor sets the respective word line voltage for the de-selected sector.

7. The control circuitry of claim 2, wherein the control logic comprises six MOS transistors, two of the MOS transistors being arranged in parallel and four of the MOS transistors being arranged in series.

8. The control circuitry of claim 6, wherein the control logic comprises three n-channel and three p-channel MOS transistors.

9. Control circuitry for use in a non-volatile electrically-erasable semiconductor memory device capable of operating in read, write and erase modes that includes a plurality of sectors, each having a plurality of MOS storage cells arranged in rows controlled by respective local word lines WLi (i=0 to M), the control circuitry comprising:

a plurality of global decoders configured to control the voltage of respective global word lines GWLB, each of the sectors being associated with a respective one of the GWLB; such that, in the write mode, a jth global decoder (j=1 to N) sets the GWLBj to a small positive voltage (SPV) when the corresponding sector is selected and to a large negative supply voltage (VPN) when the corresponding sector is de-selected; and a plurality of local decoders within each of the sectors, each of the local decoders being configured to generate a local word line voltage for a respective one of the local word lines WLi in response to a corresponding predecoder signal HXTi, corresponding local select signal LXTBi and the GWLB voltage for the sector including the local decoder, the set of local word lines WLi for the plurality of sectors sharing a common predecoder signal HXTi which is at 0 V in the write mode, the local select signal LXTBi being at VPN for predecoded local word lines WLi and at 0 V for unpredecoded word lines LXTBi; such that in the write mode:

when the GWLB voltage is at SPV, the local decoder for the selected WL couples the corresponding VPN LXTB voltage to the selected WL and the local decoders for the deselected WLs couple the 0 V LXTB voltages to the corresponding deselected WLs; and when the GWLB voltage is at VPN, the associated local decoders couple the 0 V HXT signals to the respective WLi, ensuring a solid ground level for the WLs associated with de-selected sectors.

10. The control circuitry of claim 9, wherein VPN is −11 V and SPV is 3 V.

11. The control circuitry of claim 9, wherein VPN is −11 V and SPV is between 0.5 V and 3 V.

12. The control circuitry of claim 9, wherein the local decoder comprises:

a p-channel transistor; and two n-channel transistors;

the p-channel transistor having a drain, source, gate and bulk connected, respectively to the associated HXT signal, WL and GWLB and the VPS signal;

a first of the n-channel transistors having a drain, source, gate and bulk connected, respectively, to the associated LXTB, WL and GWLB and the VNS signal; and a second of the n-channel transistors having a gate, source, drain and bulk connected, respectively, to a pull down signal (XTB) at VNS in the write mode, the VNS signal, the associated GWLB, and the VNS signal;

such that, in the write mode:

the p-channel transistor sets the respective WL voltages for the de-selected sectors; and the first n-channel transistor sets the respective WL voltages for the selected sectors.

13. Control circuitry for use in a non-volatile electrically-erasable semiconductor memory device capable of operating in read, write and erase modes that includes a plurality of sectors, each having a plurality of MOS storage cells arranged in rows controlled by respective local word lines WLi (i=0 to M), the control circuitry comprising:

a plurality of local decoders within each of the sectors, each of the local decoders comprising one p-channel MOS transistor and two n-channel MOS transistors configured to generate a local word line voltage for a respective one of the local word lines WLi in response to a set of control signals and a respective global word line (GWLB) associated with the sector including the local decoder;

a plurality of global decoders configured to control the voltage of respective global word lines GWLB; such that, in the write mode, a jth global decoder (j=1 to N) sets the jth global word line GWLBj to a small positive voltage (SPV) when the jth sector is selected and to a large negative supply voltage VNS when the jth sector is not selected, the SPV being selected so that, in the write mode, when the control signals indicate that the ith local word line is predecoded while the GWLBj indicates that the sector j is selected, the ith local decoder in the jth sector sets the ith local word line to the VNS and the kth local decoders (k not equal to i) sets the kth local word lines to a voltage between 0 V and a small negative voltage (SNV) that will not disturb the cells already programmed;

the VNS being selected so that, in the write mode, when the GWLBj indicates that the sector j is selected, the local decoders in. the jth sector set the local word lines to 0 V.

14. The control circuitry of claim 13, wherein:

the control signals comprise LXTB, XTB and HXT signals;

the p-channel transistor has a drain, source, gate and bulk respectively connected to the associated HXT signal, WL and GWLB and the VPS signal;

a first of the n-channel transistors has a drain, source, gate and bulk respectively connected to the associated LXTB, WL and GWLB and the VNS signal;

a second of the n-channel transistors has a gate, source, drain and bulk respectively connected to a pull down signal XTB, the VNS signal, the associated GWLB and the VNS signal;

such that, in the write mode:
the p-channel transistor sets the respective WL voltages for the de-selected sectors from the associated HXT signal; and
the first n-channel transistor sets the respective WL voltages for the selected sectors from the associated LXTB signal.

15. The control circuitry of claim 14, wherein the VPN is −11 V, the SPV is 3 V and the SNV is between 0 V and −0.5 V.

16. The control circuitry of claim 14, wherein the VPN is −11 V, the SPV is between 0.5 V and 3 V, and the SNV is between 0 V and −0.5 V.

17. The control circuitry of claim 14, wherein the VPN is between −6 V and −15 V, the SPV is between 0.5 and 3 V, and the SNV is between 0 V and −0.5 V.

* * * * *